US012738304B2

(12) United States Patent
Song

(10) Patent No.: US 12,738,304 B2
(45) Date of Patent: Sep. 15, 2026

(54) STACK MEMORY DEVICES COMMUNICATING VIA PACKETS

(71) Applicant: SK hynix Inc., Icheon-si (KR)

(72) Inventor: Choung Ki Song, Icheon-si (KR)

(73) Assignee: SK hynix Inc., Icheon-si (KR)

(*) Notice: Subject to any disclaimer, the term of this patent is extended or adjusted under 35 U.S.C. 154(b) by 154 days.

(21) Appl. No.: 18/771,606

(22) Filed: Jul. 12, 2024

(65) Prior Publication Data

US 2025/0182803 A1 Jun. 5, 2025

Related U.S. Application Data

(63) Continuation-in-part of application No. 18/654,843, filed on May 3, 2024, now Pat. No. 12,423,179.

(30) Foreign Application Priority Data

Dec. 5, 2023 (KR) ........................ 10-2023-0174966

(51) Int. Cl.
*G11C 8/18* (2006.01)
*G11C 8/10* (2006.01)

(52) U.S. Cl.
CPC . *G11C 8/18* (2013.01); *G11C 8/10* (2013.01)

(58) Field of Classification Search
CPC .. G11C 8/18; G11C 8/10; G11C 5/025; G11C 5/04; G11C 7/1006; G11C 7/109; G11C 7/22; G11C 2207/107
See application file for complete search history.

(56) References Cited

U.S. PATENT DOCUMENTS

| | | | |
|---|---|---|---|
| 2003/0151971 A1 | 8/2003 | Acharya et al. | |
| 2007/0047579 A1 | 3/2007 | Mukhopadhyay et al. | |
| 2021/0049062 A1 | 2/2021 | Balakrishnan et al. | |
| 2021/0349660 A1 | 11/2021 | Kim et al. | |
| 2022/0100419 A1 | 3/2022 | Jang | |
| 2023/0360689 A1* | 11/2023 | Park | G11C 11/4076 |
| 2024/0069738 A1 | 2/2024 | Kim et al. | |
| 2024/0290365 A1* | 8/2024 | Jo | G11C 7/225 |

FOREIGN PATENT DOCUMENTS

| | | |
|---|---|---|
| EP | 4254413 A2 | 10/2023 |
| KR | 1020170102418 A | 9/2017 |

* cited by examiner

*Primary Examiner* — Sultana Begum
(74) *Attorney, Agent, or Firm* — WILLIAM PARK AND ASSOCIATES LTD.

(57) ABSTRACT

A stack memory device includes a command control circuit configured to latch a command and an address in synchronization with a clock signal to generate a latch command and a latch address, decode the latch command and the latch address to generate a decoding command that is transmitted through a first interface, and encode the decoding command to generate a row control signal and a column control signal that are transmitted through a second interface, and a core control circuit configured to, based on the row control signal and the column control signal, control internal operations performed on a core chip.

24 Claims, 15 Drawing Sheets

FIG. 1

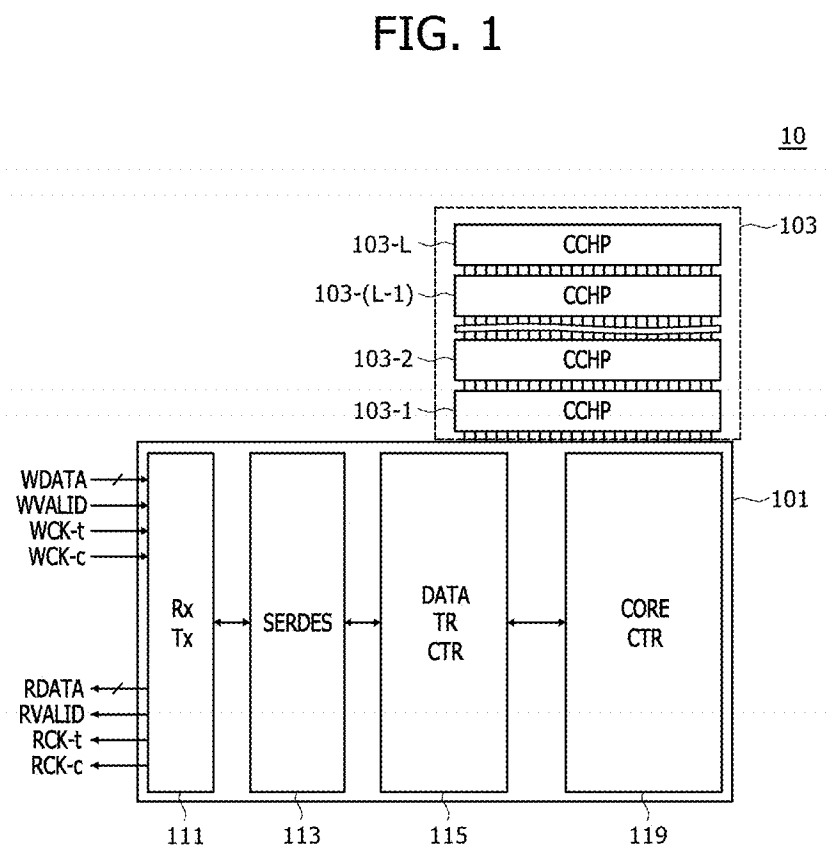

10
103
CCHP
CCHP
CCHP
CCHP
103-L
103-(L-1)
103-2
103-1
101
CORE CTR
119
DATA TR CTR
115
SERDES
113
Rx Tx
111
WDATA
WVALID
WCK-t
WCK-c
RDATA
RVALID
RCK-t
RCK-c

FIG. 4

| BL \ PIN | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 - 7 | B0 | B1 | B2 | B3 | B4 | B5 | B6 | B7 | B8 | B9 | B10 | B11 | B12 | B13 | B14 | B15 |
| 8 - 15 | B16 | B17 | B18 | B19 | B20 | B21 | B22 | B23 | B24 | B25 | B26 | B27 | B28 | B29 | B30 | B31 |
| 16 - 23 | B32 | B33 | B34 | B35 | B36 | B37 | B38 | B39 | B40 | B41 | B42 | B43 | B44 | B45 | B46 | B47 |
| 24 - 31 | B48 | B49 | B50 | B51 | B52 | B53 | B54 | B55 | B56 | B57 | B58 | B59 | B60 | B61 | B62 | B63 |

Figure 7:
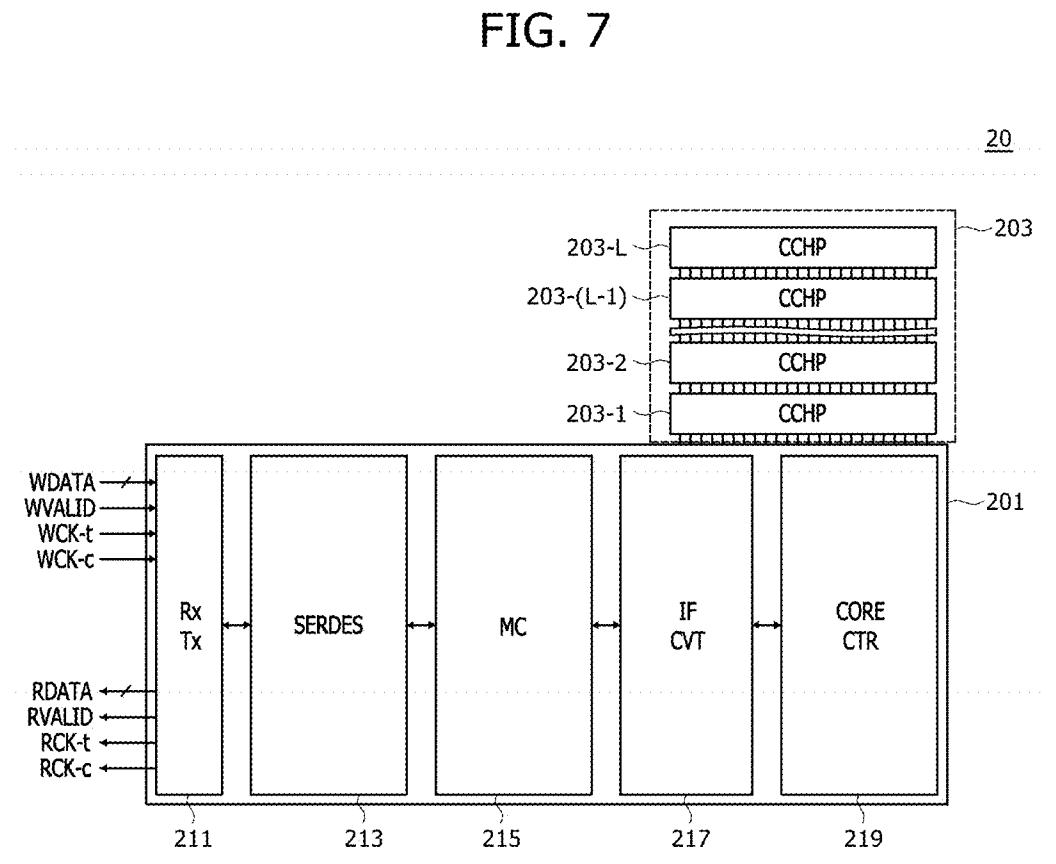

20
203
201
CCHP
CCHP
CCHP
CCHP
203-L
203-(L-1)
203-2
203-1
CORE CTR
IF CVT
MC
SERDES
Rx Tx
219
217
215
213
211
WDATA
WVALID
WCK-t
WCK-c
RDATA
RVALID
RCK-t
RCK-c

Figure 9:
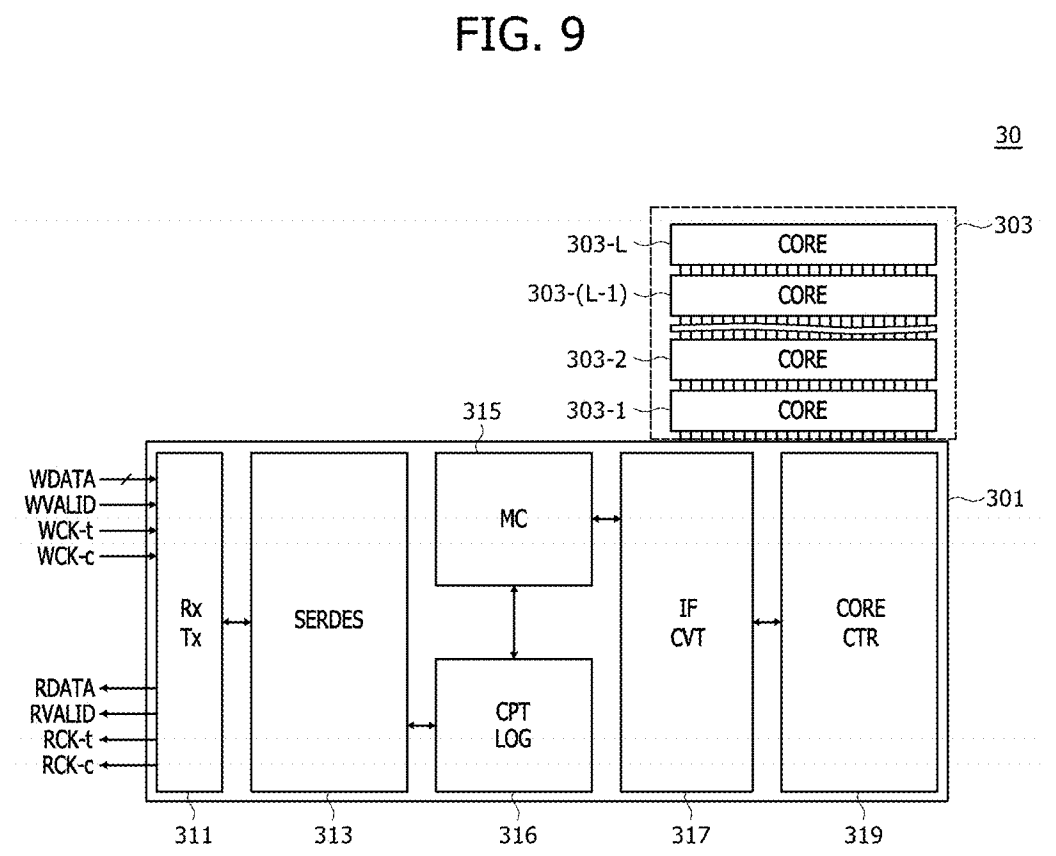

CORE
CORE
CORE
CORE

303-L
303-(L-1)
303-2
303-1

CORE CTR 319

IF CVT 317

MC 315

CPT LOG 316

SERDES 313

Rx Tx 311

WDATA
WVALID
WCK-t
WCK-c

RDATA
RVALID
RCK-t
RCK-c 40
401
403
405
407
411
413
415
417
419
421
431
433
441
PPHY
CPHY
OP CTR

FIG.13

| Function | Abbreviation | CKE Previous Cycle | CKE Current Cycle | CS | ACT | RAS / A16 | CAS / A15 | WE / A14 | BG0 - BG1 | BA0 - BA1 | C2-C0 | A12 | A17, A13, A11 | A10 | A0 - A9 |
|---|---|---|---|---|---|---|---|---|---|---|---|---|---|---|---|
| Mode Register Set | MRS | H | H | L | H | L | L | L | BG | BA | V | OP Code | | | |
| Refresh | REF | H | H | L | H | L | L | H | V | V | V | V | V | V | V |
| Self Refresh Entry | SRE | H | L | L | H | L | L | H | V | V | V | V | V | V | V |
| Self Refresh Exit | SRX | L | H | H | X | X | X | X | X | X | X | X | X | X | X |
| | | | | L | H | H | H | H | V | V | V | V | V | V | V |
| Single Bank Precharge | PRE | H | H | L | H | L | H | L | BG | BA | V | V | V | L | V |
| Precharge all Banks | PREA | H | H | L | H | L | H | L | V | V | V | V | V | H | V |
| RFU | RFU | H | H | L | H | L | H | H | RFU | | | | | | |
| Bank Activate | ACT | H | H | L | L | Row Address (RA) | | | BG | BA | V | Row Address (RA) | | | |
| Write (Fixed BL8 or BC4) | WR | H | H | L | H | H | L | L | BG | BA | V | V | V | L | CA |
| Write (BC4, on the Fly) | WRS4 | H | H | L | H | H | L | L | BG | BA | V | L | V | L | CA |
| Write (BL8, on the Fly) | WRS8 | H | H | L | H | H | L | L | BG | BA | V | H | V | L | CA |
| Write with Auto Precharge (Fixed BL8 or BC4) | WRA | H | H | L | H | H | L | L | BG | BA | V | H | V | H | CA |
| Write with Auto Precharge (BC4, on the Fly) | WRAS4 | H | H | L | H | H | L | L | BG | BA | V | L | V | H | CA |
| Write with Auto Precharge (BL8, on the Fly) | WRAS8 | H | H | L | H | H | L | L | BG | BA | V | H | V | H | CA |
| Read (Fixed BL8 or BC4) | RD | H | H | L | H | H | L | H | BG | BA | V | V | V | L | CA |
| Read (BC4, on the Fly) | RDS4 | H | H | L | H | H | L | H | BG | BA | V | L | V | L | CA |
| Read (BL8, on the Fly) | RDS8 | H | H | L | H | H | L | H | BG | BA | V | H | V | L | CA |
| Read with Auto Precharge (Fixed BL8 or BC4) | RDA | H | H | L | H | H | L | H | BG | BA | V | V | V | H | CA |
| Read with Auto Precharge (BC4, on the Fly) | RDAS4 | H | H | L | H | H | L | H | BG | BA | V | L | V | H | CA |
| Read with Auto Precharge (BL8, on the Fly) | RDAS8 | H | H | L | H | H | L | H | BG | BA | V | H | V | H | CA |
| No Operation | NOP | H | H | L | H | H | H | H | V | V | V | V | V | V | V |
| Device Deselected | DES | H | H | H | X | X | X | X | X | X | X | X | X | X | X |
| Power Down Entry | PDE | L | H | H | X | X | X | X | X | X | X | X | X | X | X |
| Power Down Exit | PDX | L | H | H | X | X | X | X | X | X | X | X | X | X | X |
| ZQ calibration Long | ZQCL | H | H | L | H | H | H | L | V | V | V | V | V | H | V |
| ZQ calibration Short | ZQCS | H | H | L | H | H | H | L | V | V | V | V | V | L | V |

FIG.14

| Command4 | Symbol | Clock Cycle | RA[0] | RA[1] | RA[2] | RA[3] | RA[4] | RA[5] | RA[6] | RA[7] | RA[8] | RA[9] |
|---|---|---|---|---|---|---|---|---|---|---|---|---|
| Row No Operation | RNOP | R or F | H | H | H | H | V | V | V | V | V | V |
| Activate | ACT | R | L | H | H | PC | SID0 /V | SID1 /V | BA0 | BA1 | BA2 | BA3 |
| | | F | H | H | RA8 | RA9 | RA10 | RA11 | RA12 | RA13 /V | RA14 /V | V |
| | | R | H | H | RA0 | RA1 | RA2 | RA3 | RA4 | RA5 | RA6 | RA7 |
| Precharge | PREpb | R or F | H | L | L | PC | SID0 /V | SID1 /V | BA0 | BA1 | BA2 | BA3 |
| Precharge All | PREab | R or F | H | L | H | PC | V | V | V | V | V | V |
| Per-Bank Refresh | REFpb | R | L | L | L | PC | SID0 /V | SID1 /V | BA0 | BA1 | BA2 | BA3 |
| All-Bank Refresh | REFab | R | H | H | L | PC | V | V | V | V | L | V |
| Per-Bank Refresh Management | RFMpb | R | L | L | H | PC | SID0 /V | SID1 /V | BA0 | BA1 | BA2 | BA3 |
| All-Bank Refresh Management | RFMab | R | H | H | L | PC | V | V | V | V | H | V |
| Power-Down Entry | PDE | R | L | H | L | H | V | V | V | V | V | V |
| | | F | L | H | L | H | V | V | V | V | V | V |
| Self Refresh Entry | SRE | R | L | H | L | L | V | V | V | V | V | V |
| | | F | L | H | L | L | V | V | V | V | V | V |
| Power-Down & Self Refresh Exit | PDX/ SRX | R | H | H | H | H | V | V | V | V | V | V |

FIG.15

| Command4 | Symbol | Clock Cycle | CA[0] | CA[1] | CA[2] | CA[3] | CA[4] | CA[5] | CA[6] | CA[7] | CA[8] |
|---|---|---|---|---|---|---|---|---|---|---|---|
| Column No Operation | CNOP | R | H | H | H | V | V | V | V | V | 1,2,3 |
| | | F | V | V | V | V | V | V | V | V | V |
| Read | RD | R | H | L | H | L | PC | SID0/V | SID1/V | BA0 | 1,2,3,5,6,7 |
| | | F | BA1 | BA2 | BA3 | CA0 | CA1 | CA2 | CA3 | CA4 | |
| Read w/AP | RDA | R | H | L | H | H | PC | SID0/V | SID1/V | BA0 | 1,2,3,5,6,7 |
| | | F | BA1 | BA2 | BA3 | CA0 | CA1 | CA2 | CA3 | CA4 | |
| Write | WR | R | H | L | L | L | PC | SID0/V | SID1/V | BA0 | 1,2,3,5,6 |
| | | F | BA1 | BA2 | BA3 | CA0 | CA1 | CA2 | CA3 | CA4 | |
| Write w/AP | WRA | R | H | L | L | H | PC | SID0/V | SID1/V | BA0 | 1,2,3,5,6 |
| | | F | BA1 | BA2 | BA3 | CA0 | CA1 | CA2 | CA3 | CA4 | |
| Mode Register Set | WRS | R | L | L | L | MA4 | OP5 | OP6 | OP7 | MA0 | 1,3,8,9 |
| | | F | MA1 | MA2 | MA3 | OP0 | OP1 | OP2 | OP3 | OP4 | |

STACK MEMORY DEVICES COMMUNICATING VIA PACKETS

CROSS-REFERENCE TO RELATED APPLICATIONS

The present application is a continuation-in-part application of U.S. patent application Ser. No. 18/654,843, filed on May 3, 2024, which claims priority under 35 U.S.C. § 119(a) to Korean Application No. 10-2023-0174966, filed on Dec. 5, 2023, in the Korean Intellectual Property Office, which applications are incorporated herein by reference in their entirety.

BACKGROUND

1. Technical Field

Some embodiments of the present disclosure relate to stack memory devices communicating in packets.

2. Related Art

Stack memory systems such as high bandwidth memory (HBM) systems are used in a wide range of applications due to excellent bandwidth and energy efficiency. Unlike existing memory systems that use a parallel data bus, the stack memory system includes a stack memory device composed of a base chip and a plurality of memory chips interconnected by through silicon vias (TSVs, hereinafter referred to as "through-vias"). The stack memory device utilizes a physical interface such as PHY for communicating with a processor, and the PHY needs to be designed to ensure high-speed data transmission and efficient communication.

SUMMARY

The present disclosure may provide a stack memory device including a command control circuit configured to latch a command and an address in synchronization with a clock signal to generate a latch command and a latch address, decode the latch command and the latch address to generate a decoding command that is transmitted through a first interface, and encode the decoding command to generate a row control signal and a column control signal that are transmitted through a second interface, and a core control circuit configured to, based on the row control signal and the column control signal, control internal operations performed on a core chip.

In addition, the present disclosure may provide a stack memory device including a command decoder configured to decode a latch command and a latch address to generate a decoding command that is transmitted through a first interface, a command encoder configured to encode the decoding command to generate a row control signal and a column control signal that are transmitted through a second interface, and a core control circuit configured to, based on the row control signal and the column control signal, control internal operations performed on a core chip.

In addition, the present disclosure may provide a stack memory device including a command decoder configured to decode a latch command and a latch address to generate a decoding command that is transmitted through a first interface, generate a data input control signal to perform a write operation on the core chip, and generate a data output control signal to perform a read operation on the core chip, a command encoder configured to encode the decoding command to generate a row control signal and a column control signal that are transmitted through a second interface, and a core control circuit configured to, based on the data input control signal, the data output control signal, the row control signal, and the column control signal, control internal operations performed on the core chip.

In addition, the present disclosure may provide a stack memory device including a base chip, and a core chip stacked on the base chip and electrically connected to the base chip. In the present disclosure, the base chip may include a command control circuit configured to latch a command and an address in synchronization with a clock signal to generate a latch command and a latch address, decode the latch command and the latch address to generate a decoding command that is transmitted through a first interface, and encode the decoding command to generate a row control signal and a column control signal that are transmitted through a second interface, and a core control circuit configured to, based on the row control signal and the column control signal, control internal operations performed on the core chip.

BRIEF DESCRIPTION OF THE DRAWINGS

FIG. 1 is a block diagram illustrating a stack memory device according to an embodiment of the present disclosure.

FIG. 4 is a table identifying data transferred during input and output operations for a packet according to an embodiment of the present disclosure.

FIG. 5 and FIG. 6 are diagrams illustrating examples of packet formats according to embodiments of the present disclosure.

FIG. 7 is a block diagram illustrating a stack memory device according to another embodiment of the present disclosure.

FIG. 9 is a block diagram illustrating a stack memory device according to a further embodiment of the present disclosure.

FIG. 13 is a table illustrating the operation of a command decoder included in the base chip shown in FIG. 12.

FIGS. 14 and 15 are tables illustrating the operation of the command decoder included in the base chip shown in FIG. 12.

DETAILED DESCRIPTION

Figure 2:
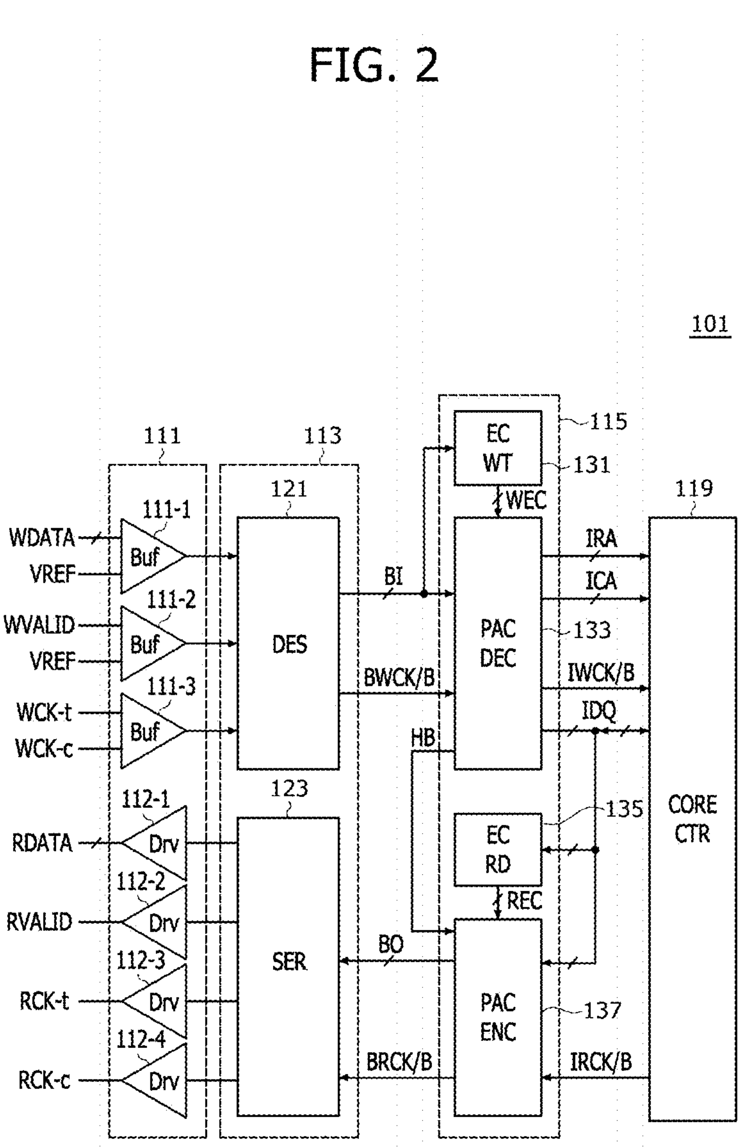
FIG. 2 is a block diagram illustrating an embodiment of a base chip included in the stack memory device.

In the following description of embodiments, when a parameter is referred to as being "predetermined," a value of the parameter may be determined in advance when the parameter is used in a process or an algorithm. The value of the parameter may be determined when the process or the algorithm starts or may be determined during a period in which the process or the algorithm is executed.

Although the terms "first," "second," "third," and so forth are used herein to describe various elements, these elements should not be limited by these terms. These terms are only used to distinguish one element from another element and are not intended to imply an order or number of elements. Thus, a first element in some embodiments may be termed a second element in other embodiments without departing from the teachings of the present disclosure.

When an element is referred to as "connected" or "coupled" to another element, the element may be directly connected or coupled to the other element or intervening elements may be present. When an element is referred to as "directly connected" or "directly coupled" to another element, no intervening elements are present.

A logic "high" level and a logic "low" level may be used to describe logic levels of electric signals. A signal at a logic "high" level is distinguished from a signal at a logic "low" level. For example, when a signal at a first voltage corresponds to a signal at a logic "high" level, a signal at a second voltage corresponds to a signal at a logic "low" level. In an embodiment, the logic "high" level may be a voltage level that is higher than a voltage level of the logic "low" level. Logic levels of signals may be different or opposite according to the embodiments. For example, a certain signal at a logic "high" level in one embodiment may be at a logic "low" level in another embodiment.

The term "logic bit set" may include a combination of logic levels of bits included in a signal. When the logic level of each of the bits included in the signal is changed, the logic bit set of the signal may be different. For example, when the signal includes two bits, when the logic level of each of the two bits included in the signal is "logic low level, logic low level," the logic bit set of the signal may be the first logic bit set, and when the logic level of each of the two bits included in the signal is "a logic low level and a logic high level," the logic bit set of the signal may be the second logic bit set.

Various embodiments of the present disclosure are described in more detail with reference to the accompanying drawings. The embodiments are described for illustrative purposes only and are not intended to limit the scope of the present disclosure.

FIG. 1 is a block diagram illustrating a stack memory device 10 according to an embodiment of the present disclosure. As shown in FIG. 1, the stack memory device 10 includes a base chip 101 and a core chip 103. The core chip 103 may be disposed on, with, or over the base chip 101. The core chip 103 may include a plurality (L) of core chips 103-1 through 103-L. Each of the plurality of core chips 103-1 through 103-L may be connected to one or more through-vias (for example, 441 in FIG. 10), and be disposed in a stacked form. The core chip 103 may receive various signals from and exchange data with the base chip 101 through the one or more through-vias.

The base chip 101 includes a transmission/reception circuit (Rx Tx) 111, a serialization/parallelization circuit (SERDES) 113, a data transmission control circuit (DATA TR CTR) 115, and a core control circuit (CORE CTR) 119.

The transmission/reception circuit 111 receives write data WDATA, a write valid signal WVALID, and transmission write clock signals WCK-t and WCK-c from an external device such as a processor (for example, 403 in FIG. 10) for a write operation and a read operation on the core chip 103. When the read operation is performed on the core chip 103, the transmission/reception circuit 111 transmits read data RDATA, a read valid signal RVALID, and transmission read clock signals RCK-t and RCK-c to the external device.

The serialization/parallelization circuit 113 receives the write data WDATA, generates a parallelized input packet (for example, BI in FIG. 2), and provides the parallelized input packet to the data transmission control circuit 115 when the write valid signal WVALID is activated in synchronization with the transmission write clock signals WCK-t and WCK-c. When the read operation is performed on the core chip 103, the serialization/parallelization circuit 113 extracts serialized read data RDATA and the read valid signal RVALID from an output packet (for example, BO in FIG. 2) generated based on internal data IDQ output from the core chip 103 and provides the serialized read data RDATA and the read valid signal RVALID to the transmission/reception circuit 111.

The data transmission control circuit 115 decodes the input packet (for example, BI in FIG. 2) to check whether any error is detected in the internal data IDQ extracted from the input packet BI when the write operation is performed on the core chip 103, and stores the internal data IDQ in the core chip 103 through the core control circuit 119. When the read operation is performed on the core chip 103, the data transmission control circuit 115 checks whether any error is detected in the internal data IDQ output from the core chip 103 and provides an output packet (for example, BO in FIG. 2) generated based on the internal data IDQ the to serialization/parallelization circuit 113. The internal data IDQ extracted from the input packet BI when the write operation is performed on the internal data IDQ and the internal data IDQ output from the core chip 103 when the read operation is performed on the core chip 103 may be separate signals transmitted through the same signal line.

When the write operation is performed on the core chip 103, the core control circuit 119 receives the internal data IDQ and controls the core chip 103 such that the internal data IDQ is stored in the core chip 103. When the read operation is performed on the core chip 103, the core control circuit 119 receives the internal data IDQ output from the core chip 103 to provide the internal data IDQ to the data transmission control circuit 115.

The stack memory device 10 configured as described above uses packets (for example, BI and BO in FIG. 2) when performing the write operation and read operation on the core chip 103, thereby improving scalability and performing high-speed operations when applied to or used in stack memory systems.

FIG. 2 is a block diagram illustrating an embodiment of the base chip 101 such as shown in FIG. 1. As shown in FIG. 2, the base chip 101 includes a transmission/reception circuit 111, a serialization/parallelization circuit 113, a data transmission control circuit 115, and a core control circuit 119.

The transmission/reception circuit 111 includes reception buffers 111-1, 111-2, and 111-3 and transmission drivers 112-1, 112-2, 112-3, and 112-4. The reception buffer 111-1 buffers the write data WDATA received serially from an external device, based on a reference voltage VREF, and provides the buffered write data WDATA to the serialization/parallelization circuit 113. The reception buffer 111-2 receives and buffers the write valid signal WVALID, based on the reference voltage VREF, and provides the buffered write valid signal WVALID to the serialization/parallelization circuit 113. The reception buffer 111-3 receives and buffers the transmission write clock signals WCK-t and WCK-c and provides the buffered transmission write clock signals WCK-t and WCK-c to the serialization/parallelization circuit 113. The transmission driver 112-1 transmits the read data RDATA received serially from the serialization/parallelization circuit 113 to the external device. The transmission driver 112-2 transmits the read valid signal RVALID received from the serialization/parallelization circuit 113 to the external device. The transmission drivers 112-3 and 112-4 transmit the transmission read clock signals RCK-t and RCK-c received from the serialization/parallelization circuit 113 to the external device.

The serialization/parallelization circuit 113 includes a parallelization circuit 121 and a serialization circuit 123.

The parallelization circuit 121 is electrically connected to the reception buffers 111-1, 111-2, and 111-3 and receives the write data WDATA, the write valid signal WVALID, and the transmission write clock signals WCK-t and WCK-c. The parallelization circuit 121 receives the write data WDATA to generate and output the parallelized input packet BI when the write valid signal WVALID is activated in synchronization with the transmission write clock signals WCK-t and WCK-c. The parallelization circuit 121 outputs the transmission write clock signals WCK-t and WCK-c as a buffer write clock signal BWCK/B. The parallelization circuit 121 is electrically connected to the data transmission control circuit 115 and provides the input packet BI and the buffer write clock signal BWCK/B to the data transmission control circuit 115. The input packet BI may be implemented or formatted as a packet used in peripheral component interconnect express (PCIe) and compute express link (CXL) protocols. PCIe and CXL are high-speed interface standards used to connect various hardware components such as graphics cards, storage devices, network cards, and the like, to each other. The input packet BI may include header information including information such as destination and packet type, information about internal control signals that control internal operations, data information stored in the core chip 103, error control information used to detect errors, and security information to prevent data sharing.

The serialization circuit 123 is electrically connected to the data transmission control circuit 115 and receives the output packet BO and a buffer read clock signal BRCK/B from the data transmission control circuit 115. The serialization circuit 123 extracts the read data RDATA and the read valid signal RVALID from the output packet BO in synchronization with the buffer read clock signal BRCK/B to provide serialized read data RDATA to the transmission driver 112-1 and provide the read valid signal RVALID to the transmission driver 112-2. The serialization circuit 123 generates transmission read clock signals RCK-t and RCK-c from the buffer read clock signal BRCK/B and provides the transmission read clock signals RCK-t and RCK-c to the transmission drivers 112-3 and 112-4, respectively.

The data transmission control circuit 115 includes a write error check circuit (EC WT) 131, a packet decoder (PAC DEC) 133, a read error check circuit (EC RD) 135, and a packet encoder (PAC ENC) 137.

The write error check circuit 131 is electrically connected to the parallelization circuit 121 and receives the input packet BI from the parallelization circuit 121. The write error check circuit 131 generates a write error check code WEC based on the input packet BI. The write error check circuit 131 may apply a cyclic redundancy check (CRC) algorithm to generate the write error check code WEC as a checksum that can be utilized to check for the errors in the internal data IDQ.

The packet decoder 133 is electrically connected to the parallelization circuit 121 and the write error check circuit 131, receives the input packet BI and the buffer write clock signal BWCK/B from the parallelization circuit 121, and receives the write error check code WEC from the write error check circuit 131. The packet decoder 133 checks whether any error is in the input packet BI based on the write error check code WEC. When at least one error is detected in the input packet BI, based on the write error check code WEC during the write operation on the core chip 103, the packet decoder 133 may receive the input packet BI again from the parallelization circuit 121. The packet decoder 133 decodes the input packet BI in synchronization with the buffer write clock signal BWCK/B to generate an internal row control signal IRA and an internal column control signal ICA. The internal row control signal IRA may be a signal utilized in row-series operations such as an active operation and a pre-charge operation on the core chip 103, and the internal column control signal ICA may be a signal utilized in column-series operations such as a read operation and a write operation on the core chip 103. The packet decoder 133 generates an internal write clock signal IWCK/B, based on the buffer write clock signal BWCK/B. For example, the internal write clock signal IWCK/B may be implemented in the same way as the buffer write clock signal BWCK/B. The present disclosure is not limited to this example. The packet decoder 133 decodes the input packet BI to extract header information HB and the internal data IDQ when the write operation is performed on the core chip 103. The input packet BI may include header information HB including information such as the destination and packet type, data information including control signals to control operations, error security information for error detection or security, and the like. The packet decoder 133 is electrically connected to the core control circuit 119 and provides the internal data IDQ to the core control circuit 119 in order to store the internal data IDQ in the core chip 103 when the write operation is performed on the core chip 103.

The read error check circuit 135 is electrically connected to the core control circuit 119 and receives the internal data IDQ from the core control circuit 119. The read error check circuit 135 generates a read error check code REC based on the internal data IDQ. The read error check circuit 135 may apply a cyclic redundancy check (CRC) algorithm to generate the read error check code REC as a checksum that can be utilized to check for the errors in the internal data IDQ.

The packet encoder 137 is electrically connected to the packet decoder 133, the read error check circuit 135, and the core control circuit 119 and receives the header information HB from the packet decoder 133, receives the read error check code REC from the read error check circuit 135, and receives an internal read clock signal IRCK/B from the core control circuit 119. The packet encoder 137 receives the internal data IDQ from the core control circuit 119 when the read operation is performed on the core chip 103. The packet encoder 137 checks whether any error is in the internal data IDQ received during the read operation on the core chip 103 based on the read error check code REC. When at least one error is detected in the internal data IDQ based on the read error check code REC during the read operation on the core chip 103, the packet encoder 137 may receive the internal data IDQ again from the core chip 103 through the core control circuit 119. The packet encoder 137 generates the output packet BO based on the header information HB and the internal data IDQ. The output packet BO may be a packet used in PCIe and CXL protocols. The packet encoder 137 generates the buffer read clock signal BRCK/B based on the internal read clock signal IRCK/B. For example, the buffer read clock signal BRCK/B may be implemented in the same manner as the internal read clock signal IRCK/B. The present disclosure is not limited to this example.

The core control circuit 119 is electrically connected to the packet decoder 133 and receives the internal row control signal IRA, the internal column control signal ICA, the internal write clock signal IWCK/B, and the internal data IDQ from the packet decoder 133. The core control circuit 119 receives the internal write clock signal IWCK/B and the internal data IDQ from the packet decoder 133 when the write operation is performed on the core chip 103 based on the internal row control signal IRA and the internal column control signal ICA. The core control circuit 119 controls the core chip 103 such that the internal data IDQ is stored in the core chip 103 in synchronization with the internal write clock signal IWCK/B when the write operation is performed on the core chip 103. The core control circuit 119 provides the internal data IDQ as the data output from the core chip 103 to the packet encoder 137 when the read operation is performed on the core chip 103. The core control circuit 119 provides the internal read clock signal IRCK/B to the packet encoder 137 when the read operation is performed on the core chip 103.

The operation of the stack memory device 10 configured as described above is described as follows with respect to two examples, an example in which a write operation is performed on the core chip 103 and an example in which a read operation is performed on the core chip 103.

For the write operation on the core chip 103, the parallelization circuit 121 receives the write data WDATA, the write valid signal WVAID, and the transmission write clock signals WCK-t and WC-c from the reception buffers 111-1, 111-2, and 111-3 and receives the write data WDATA to generate the parallelized input packet BI when the write valid signal WVALID is activated in synchronization with the transmission write clock signals WCK-t and WC-c. The packet decoder 133 checks whether any error is in the input packet BI based on the write error check code WEC and receives the input packet BI again when at least one error is detected in the input packet BI. The packet decoder 133 decodes the input packet BI to generate the internal row control signal IRA and the internal column control signal ICA. The core control circuit 119 receives the internal write clock signal IWCK/B and the internal data IDQ from the packet decoder 133 when the write operation is performed on the core chip 103 based on the internal row control signal IRA and the internal column control signal ICA and controls the core chip 103 such that the internal data IDQ is stored in the core chip 103 in synchronization with the internal write clock signal IWCK/B.

For the read operation on the core chip 103, the parallelization circuit 121 receives the write data WDATA, the write valid signal WVALID, and the transmission write clock signals WCK-t and WCK-c from the reception buffers 111-1, 111-2, and 111-3 and receives the write data WDATA to generate the parallelized input packet BI when the write valid signal WVALID is activated in synchronization with the transmission write clock signals WCK-t and WCK-c. The packet decoder 133 checks whether any error is in the input packet BI based on the write error check code WEC and receives the input packet BI again when at least one error is in the input packet BI. The packet decoder 133 may decode the input packet BI to generate the header information HB, the internal row control signal IRA, and the internal column control signal ICA. The core control circuit 119 may output the data output from the core chip 103 as the internal data IDQ when the read operation is performed on the core chip 103 based on the internal row control signal IRA and the internal column control signal ICA. The read error check circuit 135 may generate the read error check code REC, based on the internal data IDQ. The packet encoder 137 may check whether any error is in the internal data IDQ, based on the read error check code REC, and receive the internal data IDQ again when at least one error is detected in the internal data IDQ. The packet encoder 137 may generate the output packet BO, based on the header information HB and the internal data IDQ. The serialization circuit 123 extracts the read data RDATA and the read valid signal RVALID from the output packet BO in synchronization with the buffer read clock signal BRCK/B to provide serialized read data RDATA to the transmission driver 112-1, and provide the read valid signal RVALID to the transmission driver 112-2. The serialization circuit 123 generates the transmission read clock signals RCK-t and RCK-c from the buffer read clock signal BRCK/B and provides the transmission read clock signals RCK-t and RCK-c to the transmission drivers 112-3 and 112-4. The transmission drivers 112-1, 112-2, 112-3, and 112-4 provide the read data RDATA, the read valid signal RVALID, and the transmission read clock signals RCK-t and RCK-c to an external device.

Figure 3:
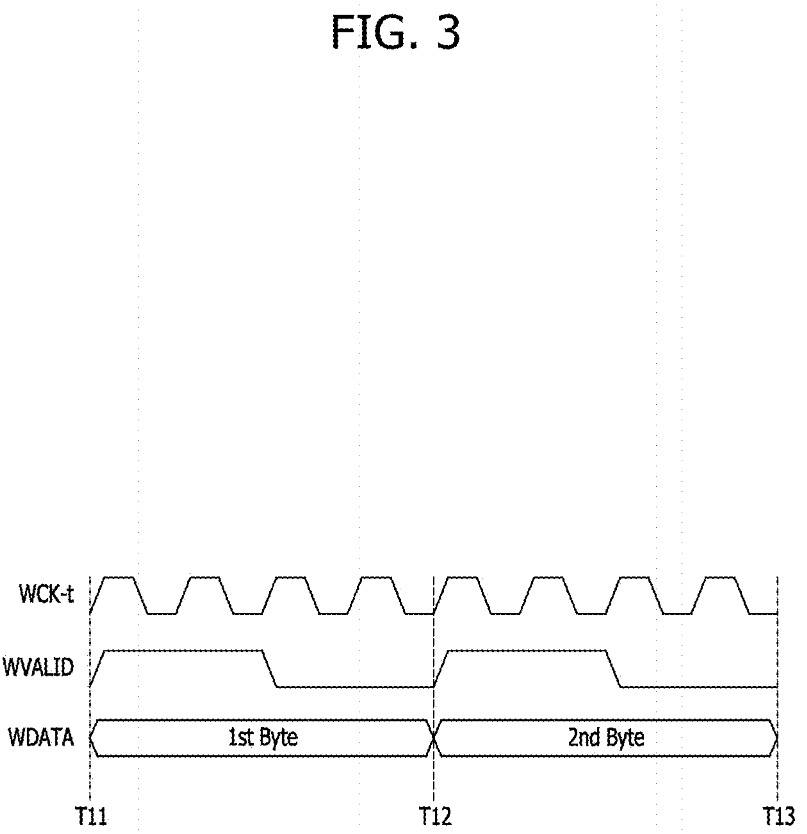
FIG. 3 is a timing diagram illustrating timing of a write operation of a stack memory device according to an embodiment of the present disclosure.

FIG. 3 is a timing diagram illustrating timing of a write operation in which the write data WDATA is transmitted in synchronization with the write valid signal WVALID during the write operation of the stack memory device 10 such as shown in FIG. 1.

Referring to FIG. 2 and FIG. 3, when the write operation is performed in the stack memory device 10, the write data WDATA is received by the transmission/reception circuit 111 based on the transmission write clock signal WCK-t and the write valid signal WVALID. More specifically, when the write valid signal WVALID is activated for the first time in synchronization with the transmission write clock signal WCK-t from time period T11 through T12, the first Byte (1st Byte) of the write valid signal WVALID is received, and when the write valid signal WVALID is activated for the second time in synchronization with the transmission write clock signal WCK-t from time period T12 through T13, the second Byte (2nd Byte) of the write valid signal WVALID is received. In one example, the write valid signal WVALID is activated at a logic "high" level during the preset time periods for receiving the write valid signal WVALID, although the present disclosure is not limited to this example.

FIG. 4 is a table identifying data transferred during the operations of inputting and outputting packets according to an embodiment of the present disclosure. The operations of inputting and outputting a packet consisting of 64 Bytes through 16 pins (PIN) are described with reference to FIG. 4. The pins may be any form of electrical connection between devices, for example, between the base chip 101 and the core chip 103.

During the first burst length (BL0-7) period, the first 16 Bytes B0 through B15 are input and output through the first pin PIN0 through the sixteenth pin PIN15. The second 16 Bytes B16 through B31 are input and output through the first pin PIN0 through the sixteenth pin PIN15 during the second burst length (BL8-15) period. The third 16 Bytes B32 through B47 are input and output through the first pin PIN0 through the sixteenth pin PIN15 during the third burst length (BL16-23) period. The fourth 16 Bytes B48 through B63 are input and output through the first pin PIN0 through the sixteenth pin PIN15 during the fourth burst length (BL24-31) period. The data input and output operations may be performed in order from the top row to the bottom row of the table of FIG. 4 or in a different order. In this example, the operations of inputting and outputting the packet consisting of 64 Bytes through 16 pins during 4 burst length periods (BL0-31) is described, although the present disclosure is not limited to this example.

Figure 5:
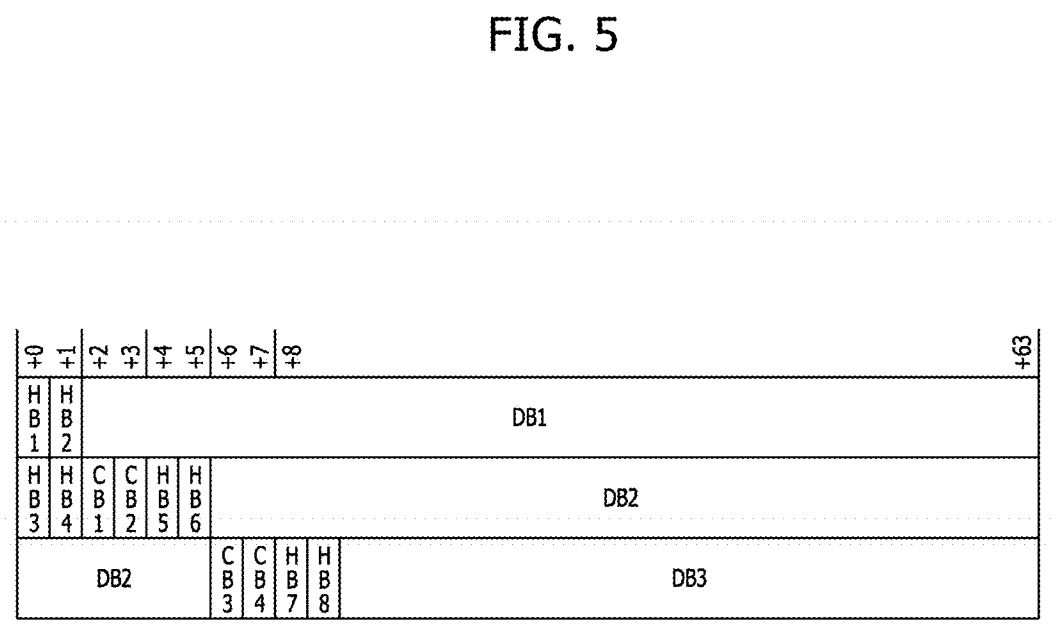
Figure 6:
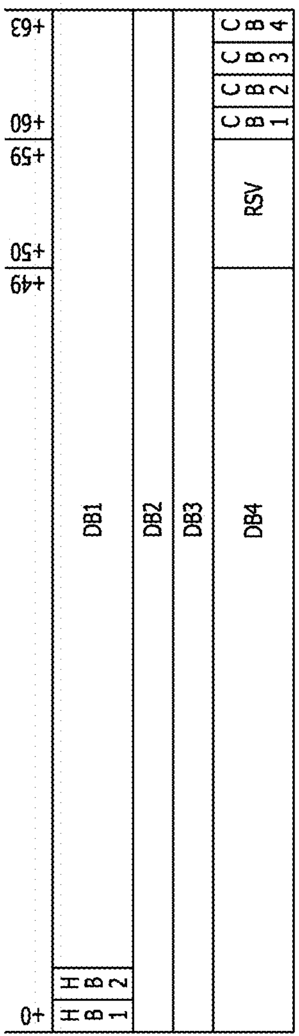

FIG. 5 and FIG. 6 are diagrams illustrating examples of packet formats according to embodiments of the present disclosure.

As shown in FIG. 5, the packet, according to an example, is composed of 192 Bytes, including three blocks each composed of 64 Bytes. The first block in the packet includes 2 Bytes of header information HB1 and HB2 and 62 Bytes of information DB1. The second block in the packet include 4 Bytes of header information HB3, HB4, HB5, and HB6, 2 Bytes of error control information CB1 and CB2, and 58 Bytes of information DB2. The third block in the packet includes 2 Bytes of header information HB7 and HB8, 2 Bytes of error control information CB3 and CB4, and 60 bytes of information DB2 and DB3.

As shown in FIG. 6, the packet according to another example is composed of 256 Bytes, including 4 blocks each composed of 64 Bytes. The first block included in the packet may include 2 Bytes of header information HB1 and HB2 and 62 Bytes of information DB1. The second block included in the packet may include 64 Bytes of information DB2. The third block included in the packet may include 64 Bytes of information DB3. The fourth block included in the packet may include 10 Bytes of reservation information RSV, 4 Bytes of error control information CB3 and CB4, and 50 Bytes of information DB4. The reservation information RSV may include information secured or kept aside for subsequent use.

The configurations of the packet discussed above are only examples, and the numbers of Bytes included in the packet, the numbers of Bytes included in the blocks and the header information, error control information, and arrangement of the internal control signals may be implemented in various ways depending on the embodiment.

FIG. 7 is a block diagram illustrating a stack memory device 20 according to another embodiment of the present disclosure. As shown in FIG. 7, the stack memory device 20 includes a base chip 201 and a core chip 203. The core chip 203 may be disposed on, with, or over the base chip 201. The core chip 203 may include a plurality of core chips 203-1 through 203-L. Each of the plurality (L) of core chips 203-1 through 203-L may be connected to each other through one or more through-vias (for example, 441 in FIG. 10), and may be disposed in a stacked form. The core chip 203 may receive various signals from and exchange data with the base chip 201 through the one or more through-vias.

The base chip 201 includes a transmission/reception circuit (Rx Tx) 211, a serialization/parallelization circuit (SERDES) 213, a memory controller (MC) 215, an interface converting circuit (IF CVT) 217, and a core control circuit (CORE CTR) 219.

The transmission/reception circuit 211 receives write data WDATA, a write valid signal WVALID, and transmission write clock signals WCK-t and WCK-c from an external device such as a processor (for example, 403 in FIG. 10) for a write operation and a read operation on the core chip 203. The transmission/reception circuit 211 transmits read data RDATA, a read valid signal RVALID, and transmission read clock signals RCK-t and RCK-c to the external device for the read operation on the core chip 203.

The serialization/parallelization circuit 213 receives the write data WDATA to generate a parallelized input packet (for example, BI in FIG. 8) and provides the parallelized input packet (for example, BI in FIG. 8) to the memory controller 215 when the write valid signal WVALID is activated in synchronization with the transmission write clock signals WCK-t and WCK-c. When a read operation is performed, the serialization/parallelization circuit 213 extracts serialized read data RDATA and a read valid signal RVALID from an output packet (for example, B0 in FIG. 8) generated based on internal data IDQ output from the core chip 203 and provides the serialized read data RDATA and the read valid signal RVALID to the transmission/reception circuit 211.

Figure 8:
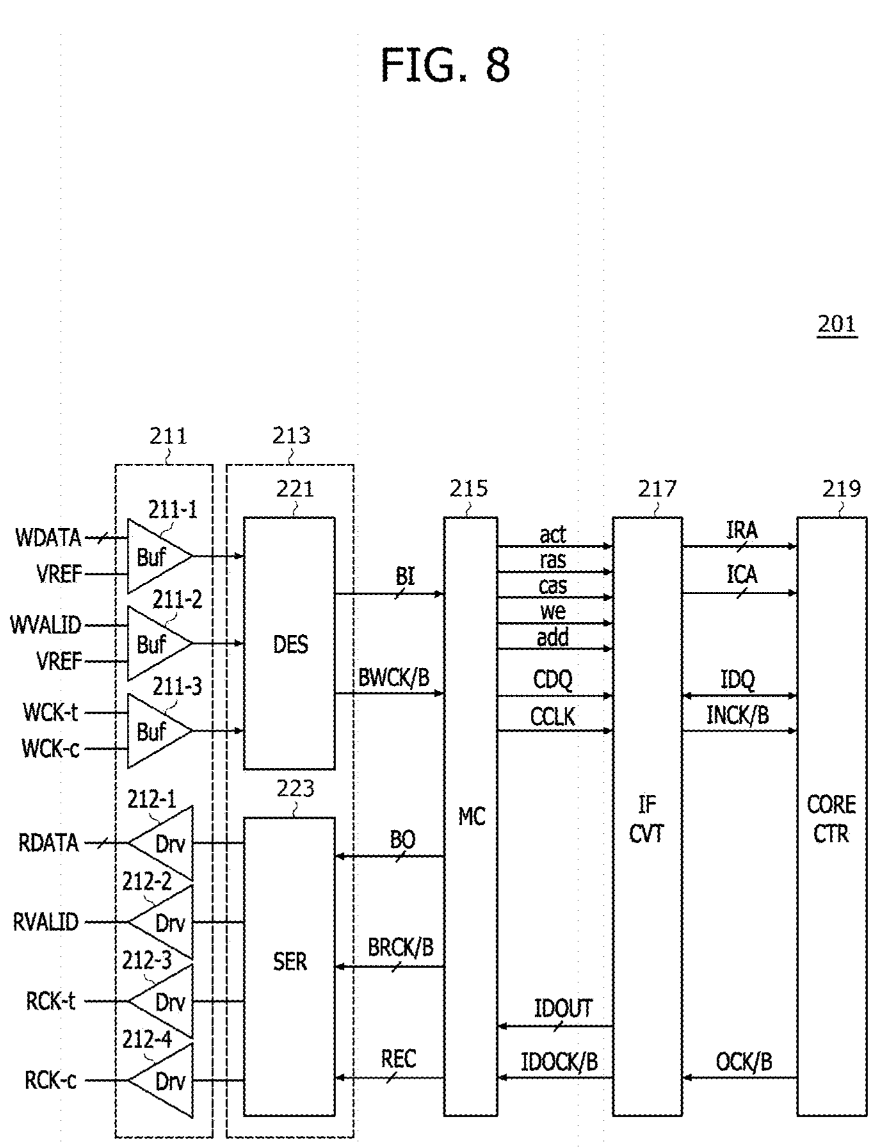
FIG. 8 is a block diagram illustrating an embodiment of a base chip included in the stack memory device.

The memory controller 215 generates control commands (for example, act, ras, cas, and we in FIG. 8) for controlling internal operations on the core chip 203 and an address (for example, add in FIG. 8) based on the input packet (for example, BI in FIG. 8). The memory controller 215 extracts control data (for example, CDQ in FIG. 8) from the input packet (for example, BI in FIG. 8) when a write operation is performed on the core chip 203. The memory controller 215 generates the output packet (for example, B0 in FIG. 8) and a read error check code (for example, REC in FIG. 8) based on internal output data (for example, IDOUT in FIG. 8) when a read operation is performed on the core chip 203.

The interface converting circuit 217 converts the control commands (for example, act, ras, cas, and we in FIG. 8) into an internal row control signal (for example, IRA in FIG. 8) and an internal column control signal (for example, ICA in FIG. 8). The interface converting circuit 217 converts the control data CDQ into the internal data IDQ via an interface to the memory controller 215 and provides the internal data IDQ via an interface to the core control circuit 219 to perform operations on the core chip 203 when the write operation is performed on the core chip 203. The interface converting circuit 217 converts the internal data IDQ into the internal output data IDOUT via the interface to the control circuit 219 and provides the internal output data IDOUT to the interface to the memory controller 215 when the read operation is performed on the core chip 203.

The core control circuit 219 receives the internal data IDQ from the interface converting circuit 217 and stores the internal data IDQ in the core chip 203 when the write operation is performed on the core chip 203. The core control circuit 219 receives the internal data IDQ output from the core chip 203 and provides the internal data IDQ to the interface converting circuit 217 when the read operation is performed on the core chip 203.

The stack memory device 20 configured as described above uses packets (for example, BI and BO in FIG. 8) when performing write and read operations on the core chip 203, thereby improving scalability and performing high-speed operations when applied to or used in a stacked memory system. In addition, the stack memory device 20 may be provided with the memory controller 215 that operates with different interfaces through the interface converting circuit 217, thereby providing system-on-chip high-speed operations.

FIG. 8 is a block diagram illustrating an embodiment of the base chip 201 such as shown in FIG. 7. As shown in FIG. 8, the base chip 201 includes a transmission/reception circuit 211, a serialization/parallelization circuit 213, a memory controller 215, an interface converting circuit 217, and a core control circuit 219.

The transmission/reception circuit 211 includes reception buffers 211-1, 211-2, and 211-3 and transmission drivers 212-1, 212-2, 212-3, and 212-4. The reception buffer 211-1 buffers the write data WDATA received serially from an external device, based on a reference voltage VREF, and provides the buffered write data WDATA to the serialization/ parallelization circuit 213. The reception buffer 211-2 receives and buffers the write valid signal WVALID, based on the reference voltage VREF, and provides the buffered write valid signal WVALID to the serialization/parallelization circuit 213. The reception buffer 211-3 receives and buffers the transmission write clock signals WCK-t and WCK-c and provides the buffered transmission write clock signals WCK-t and WCK-c to the serialization/parallelization circuit 213. The transmission driver 212-1 transmits the read data RDATA received serially from the serialization/parallelization circuit 213 to the external device. The transmission driver 212-2 transmits the read valid signal RVALID received from the serialization/parallelization circuit 213 to the external device. The transmission drivers 212-3 and 212-4 transmits the transmission read clock signals RCK-t and RCK-c received from the serialization/parallelization circuit 213 to the external device.

The serialization/parallelization circuit 213 includes a parallelization circuit 221 and a serialization circuit 223.

The parallelization circuit 221 is electrically connected to the reception buffers 211-1, 211-2, and 211-3 and receives the write data WDATA, the write valid signal WVALID, and the transmission write clock signals WCK-t and WCK-c. The parallelization circuit 221 receives the write data WDATA to generate and output the parallelized input packet BI when the write valid signal WVALID is activated in synchronization with the transmission write clock signals WCK-t and WCK-c. The parallelization circuit 221 outputs the transmission write clock signals WCK-t and WCK-c as the buffer write clock signal BWCK/B. The parallelization circuit 221 is electrically connected to the memory controller 215 and provides the input packet BI and the buffer write clock signal BWCK/B to the memory controller 215. The input packet BI may be implemented or formatted as a packet used in the PCIe and CXL protocols.

The serialization circuit 223 is electrically connected to the memory controller 215 and receives the output packet B0, the buffer read clock signal BRCK/B, and the read error check code REC from the memory controller 215. The serialization circuit 223 may receive the output packet B0 again from the memory controller 215 when at least one error is detected in the output packet B0 based on the read error check code REC. The serialization circuit 223 extracts the read data RDATA and the read valid signal RVALID from the output packet B0 in synchronization with the buffer read clock signal BRCK/B and provides the serialized read data RDATA to the transmission driver 212-1 and provide the read valid signal RVALID to the transmission driver 212-2. The serialization circuit 223 generates the transmission read clock signals RCK-t and RCK-c from the buffer read clock signal BRCK/B and provides the transmission read clock signals RCK-t and RCK-c to the transmission drivers 212-3 and 212-4, respectively. The output packet B0 may be implemented or formatted as a packet used in the PCIe and CXL protocols.

The memory controller 215 is electrically connected to the serialization/parallelization circuit 213 and the interface converting circuit 217, receives the input packet BI and the buffer write clock signal BWCK/B from the serialization/parallelization circuit 213, and receives the internal output data IDOUT and the internal output clock signal IDOCK/B from the interface converting circuit 217. The memory controller 215 generates control commands act, ras, cas, and we for controlling the internal operations on the core chip 203 and an address add based on the input packet BI and the buffer write clock signal BWCK/B. The internal operations on the core chip 203 include an active operation, a read operation, a write operation, a pre-charge operation, and the like. When a write operation is performed on the core chip 203, the memory controller 215 extracts control data CDQ from the input packet BI and generates a control clock signal CCLK from the buffer write clock signal BWCK/B and provides the control data CDQ and the control clock signal CCLK to the interface converting circuit 217. When a read operation is performed on the core chip 203, the memory controller 215 provides to the serialization/parallelization circuit 213 the output packet B0, the buffer read clock signal BRCK/B, and the read error check code REC generated based on the internal output data IDOUT and the internal output clock signal IDOCK/B. The read error check code REC may be generated based on a cyclic redundancy check (CRC) algorithm.

The interface converting circuit 217 is electrically connected to the memory controller 215 and the core control circuit 219 and receives the control commands act, ras, cas, and we, the address add, the control data CDQ, and the control clock signal CCLK from the memory controller 215 and receives the internal data IDQ and the output clock signal OCK/B from the core control circuit 219. The interface converting circuit 217 converts the control commands act, ras, cas, and we and the address add into an internal row control signal IRA and an internal column control signal ICA and provides the internal row control signal IRA and the internal column control signal ICA to the core control circuit 219. The control commands act, ras, cas, and we and the address add may be provided by an interface to the memory controller 215, and the internal row control signal IRA and the internal column control signal ICA may be provided by an interface to the core control circuit 219 that utilizes the internal row control signal IRA and the internal column control signal ICA to perform operations on the core chip 203. The method by which the control commands act, ras, cas, and we and the addresses add are converted into the internal row control signal IRA and the internal column control signal ICA may be determined in various ways depending on the embodiment.

When a write operation is performed on the core chip 203, the interface converting circuit 217 converts the control data CDQ and the control clock signal CCLK into the internal data IDQ and an input clock signal INCK/B and provides the internal data IDQ and the input clock signal INCK/B to the core control circuit 219. The control data CDQ and the control clock signal CCLK may be provided by the interface to the memory controller 215, and the internal data IDQ and the input clock signal INCK/B may be provided by the interface to the core control circuit 219 based on operations with the core chip 203. The method by which the control data CDQ and the control clock signal CCLK are converted into the internal data IDQ and the input clock signal INCK/B may be determined in various ways depending on the embodiment. When the read operation is performed on the core chip 203, the interface converting circuit 217 converts the internal data IDQ and the output clock signal OCK/B into the internal output data IDOUT and the internal output clock signal IDOCK/B and provides the internal output data IDOUT and the internal output clock signal IDOCK/B to the memory controller 215. The internal data IDQ and the output clock signal OCK/B may be provided by the interface to the core control circuit 219 based on operations with the core chip 203, and the internal output data IDOUT and the internal output clock signal IDOCK/B may be provided by the interface to the memory controller 215. The method by which the internal data IDQ and the output clock signal OCK/B are converted into the internal output data IDOUT and the internal output clock signal IDOCK/B may be determined in various ways depending on the embodiment.

The core control circuit 219 receives the internal data IDQ and the input clock signal INCK/B from the interface converting circuit 217 when the write operation is performed on the core chip 203 based on the internal row control signal IRA and the internal column control signal ICA. The core control circuit 219 controls the core chip 203 such that the internal data IDQ is stored in the core chip 203 in synchronization with the input clock signal INCK/B when the write operation is performed on the core chip 203. The core control circuit 219 provides the data output from the core chip 203 as the internal data IDQ to the interface converting circuit 217 when the read operation is performed on the core chip 203. The core control circuit 219 provides the output clock signal OCK/B to the interface converting circuit 217 when the read operation is performed on the core chip 203.

The operation of the stack memory device 20 configured as described above is described as follows with respect to two examples, an example in which a write operation is performed on the core chip 203 and an example in which a read operation is performed on the core chip 203.

For the write operation on the core chip 203, the parallelization circuit 221 receives the write data WDATA, the write valid signal WVALID, and the transmission write clock signals WCK-t and WCK-c from the reception buffers 211-1, 211-2, and 211-3 and receives the write data WDATA when the write valid signal WVALID is activated in synchronization with the transmission write clock signals WCK-t and WCK-c to generate the parallelized input packet BI. The memory controller 215 generates the control commands act, ras, cas, and we and the address add based on the input packet BI and the buffer write clock signal BWCK/B, extracts the control data CDQ from the input packet BI, and generates the control clock signal CCLK from the buffer write clock signal BWCK/B. The interface converting circuit 217 converts the control commands act, ras, cas, and we into the internal row control signal IRA and the internal column control signal ICA and converts the control data CDQ and the control clock signal CCLK into the internal data IDQ and the input clock signal INCK/B, respectively. The core control circuit 219 controls the core chip 203 such that the internal data IDQ is stored in the core chip 203 in synchronization with the input clock signal INCK/B.

For a read operation on the core chip 203, the parallelization circuit 221 receives the write data WDATA, the write valid signal WVALID, and the transmission write clock signals WCK-t and WCK-c from the reception buffers 211-1, 211-2, and 211-3 and receives the write data WDATA to generate the parallelized input packet BI when the write valid signal WVALID is activated in synchronization with the transmission write clock signals WCK-t and WCK-c. The memory controller 215 generates the control commands act, ras, cas, and we and the address add based on the input packet BI and the buffer write clock signal BWCK/B, extracts the control data CDQ from the input packet BI, and generates the control clock signal CCLK from the buffer write clock signal BWCK/B. The interface converting circuit 217 converts the control commands act, ras, cas, and we into the internal row control signal IRA and the internal column control signal ICA. The core control circuit 219 outputs the data output from the core chip 203 as the internal data IDQ and outputs the output clock signal OCK/B based on the internal row control signal IRA and the internal column control signal ICA. The interface converting circuit 217 converts the internal data IDQ and the output clock signal OCK/B into the internal output data IDOUT and the internal output clock signal IDOCK/B. The memory controller 215 generates the output packet B0, the buffer read clock signal BRCK/B, and the read error check code REC, based on the internal output data IDOUT and the internal output clock signal IDOCK/B. The serialization circuit 223 receives the output packet B0 again from the memory controller 215 when at least one error is detected in the output packet B0 based on the read error check code REC. The serialization circuit 223 extracts the read data RDATA and the read valid signal RVALID from the output packet B0 in synchronization with the buffer read clock signal BRCK/B and provides the serialized read data RDATA to the transmission driver 212-1 and provides the read valid signal RVALID to the transmission driver 212-2. The serialization circuit 223 generates the transmission read clock signals RCK-t and RCK-c from the buffer read clock signal BRCK/B and provides the transmission read clock signals RCK-t and RCK-c to the transmission drivers 212-3 and 212-4, respectively. The transmission drivers 212-1, 212-2, 212-3, 212-4 may transmit the read data RDATA, the read valid signal RVALID, and the transmission read clock signals RCK-t and RCK-c to an external device.

FIG. 9 is a block diagram illustrating a stack memory device 30 according to a further embodiment of the present disclosure. As shown in FIG. 9, the stack memory device 30 includes a base chip 301 and a core chip 303. The core chip 303 may be disposed on, with, or over the base chip 301. The core chip 303 may include a plurality (L) of core chips 303-1 through 303-L. Each of the plurality of core chips 303-1 through 303-L may be connected to each other through one or more through-vias (for example, 441 in FIG. 10), and may be disposed in a stacked form. The core chip 303 may receive various signals from and exchange data with the base chip 301 through the one or more through-vias.

The base chip 301 includes a transmission/reception circuit (Rx Tx) 311, a serialization/parallelization circuit (SERDES) 313, a memory controller (MC) 315, a calculation circuit (CPT LOG) 316, an interface converting circuit (IF CVT) 317, and a core control circuit (CORE CTR) 319.

The calculation circuit 316 is electrically connected to the serialization/parallelization circuit 313 and the memory controller 315 and performs calculation operations of the serialization/parallelization circuit 313 and calculation operations of the memory controller 315. The stack memory device 30 shown in FIG. 9 may be implemented in the same way as the stack memory device 20 shown in FIG. 7, except for the calculation circuit 316. Accordingly, the transmission/reception circuit 311, the serialization/parallelization circuit 313, the memory controller 315, the interface converting circuit 317, and the core control circuit 319 may be implemented in the same way as the transmission/reception circuit 211, the serialization/parallelization circuit 213, the memory controller 215, the interface converting circuit 217, and the core control circuit 219, respectively, as previously described with reference to FIG. 7.

Figure 10:
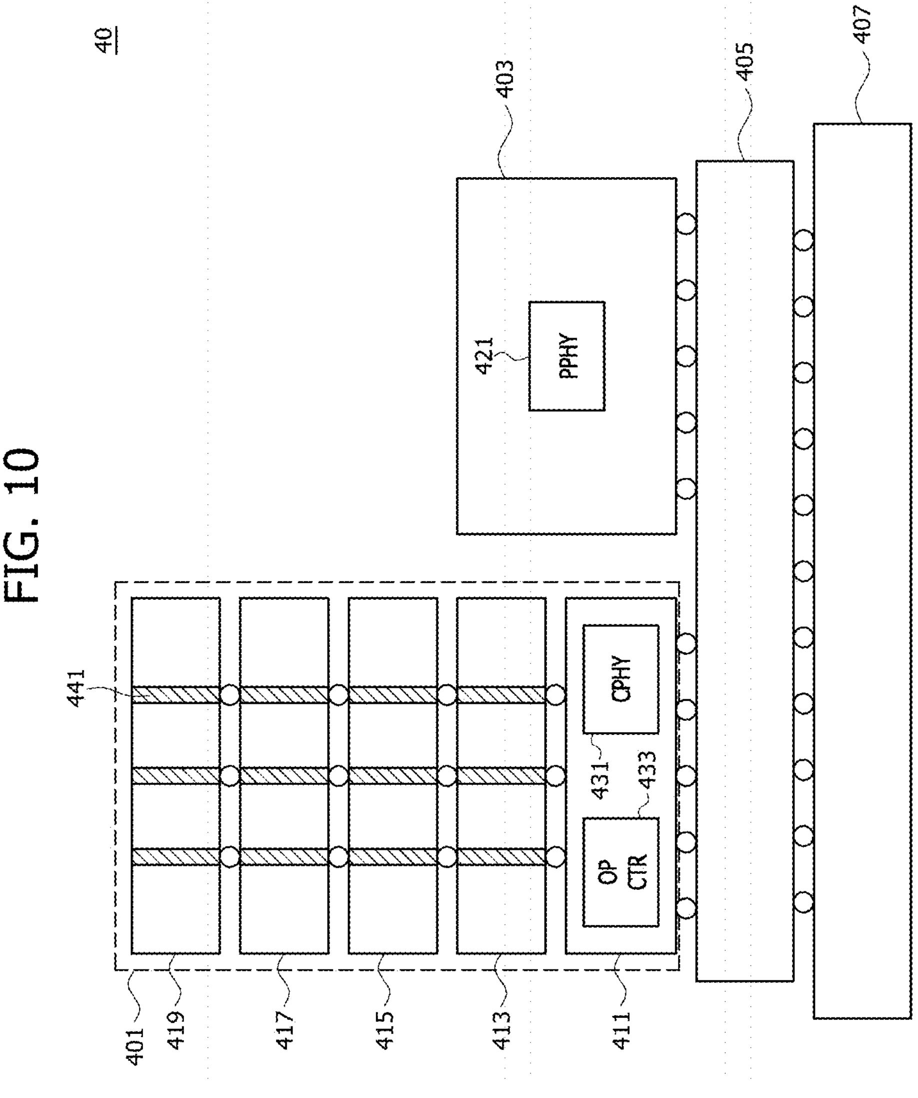
FIG. 10 is a block diagram illustrating a stack memory system according to an embodiment of the present disclosure.

FIG. 10 is a block diagram illustrating a stack memory system 40 according to an embodiment of the present disclosure. As shown in FIG. 10, the stack memory system 40 includes a stack memory device 401, a processor 403, an interposer 405, and a substrate 407.

The interposer 405 may be disposed on, with, or over the substrate 407, and the stack memory device 401 and the processor 403 may be disposed on, with, or over the interposer 405. The interposer 405 may electrically connect the substrate 407, the stack memory device 401, and the processor 403 to each other. The pitch differences between the substrate 407, the stack memory device 401, and the processor 403 are large, such that the substrate 407, the stack memory device 401, and the processor 403 may be electrically connected to each other using the interposer 405 that contains variously formed wires or other electrically conductive connection devices.

The processor 403 includes a processor interface circuit (PPHY) 421. The processor 403 provides write control signals containing commands for controlling various internal operations of the stack memory device 401 and addresses to the stack memory device 401 through the processor interface circuit 421 and receives read control signals from the stack memory device 401 through the processor interface circuit 421. The write control signals may include write data WDATA, a write valid signal WVALID, and transmission write clock signals WCK-t and WCK-c, such as shown in FIG. 1, FIG. 7, and FIG. 9. The read control signals may include read data RDATA, a read valid signal RVALID, and transmission read clock signals RCK-t and RCK-c, such as shown in FIG. 1, FIG. 7, and FIG. 9.

The stack memory device 401 includes a base chip 411 and core chips 414, 415, 417, and 419. The stack memory device 401 may be implemented similar to the stack memory device 10 shown in FIG. 1, the stack memory device 20 shown in FIG. 7, and/or the stack memory device 30 shown in FIG. 9.

The core chips 414, 415, 417, and 419 may be sequentially stacked on, with, or over the base chip 411 and receive various signals from the base chip 411 through one or more through-vias 441.

The base chip 411 includes a core interface circuit (CPHY) 431 and an operation control circuit (OP CTR) 433. The core interface circuit 431 enables communication with the processor interface circuit 421 to transmit the write control signals transmitted from the processor 403 to the operation control circuit 433 and provides the read control signals generated by the operation control circuit 433 to the processor 403. The core interface circuit 431 may be implemented with the transmission/reception circuit 111, the serialization/parallelization circuit 113, and the data transmission control circuit 115 shown in FIG. 1, the transmission/reception circuit 211 and the serialization/parallelization circuit 213 shown in FIG. 7, and/or the transmission/reception circuit 311 and the serialization/parallelization circuit 313 shown in FIG. 9. The operation control circuit 433 may be implemented with the core control circuit 119 shown in FIG. 1, the memory controller 215, the interface converting circuit 217, and the core control circuit 219 shown in FIG. 7, and/or the memory controller 315, the calculation circuit 316, the interface converting circuit 317, and the core control circuit 319 shown in FIG. 9.

Figure 11:
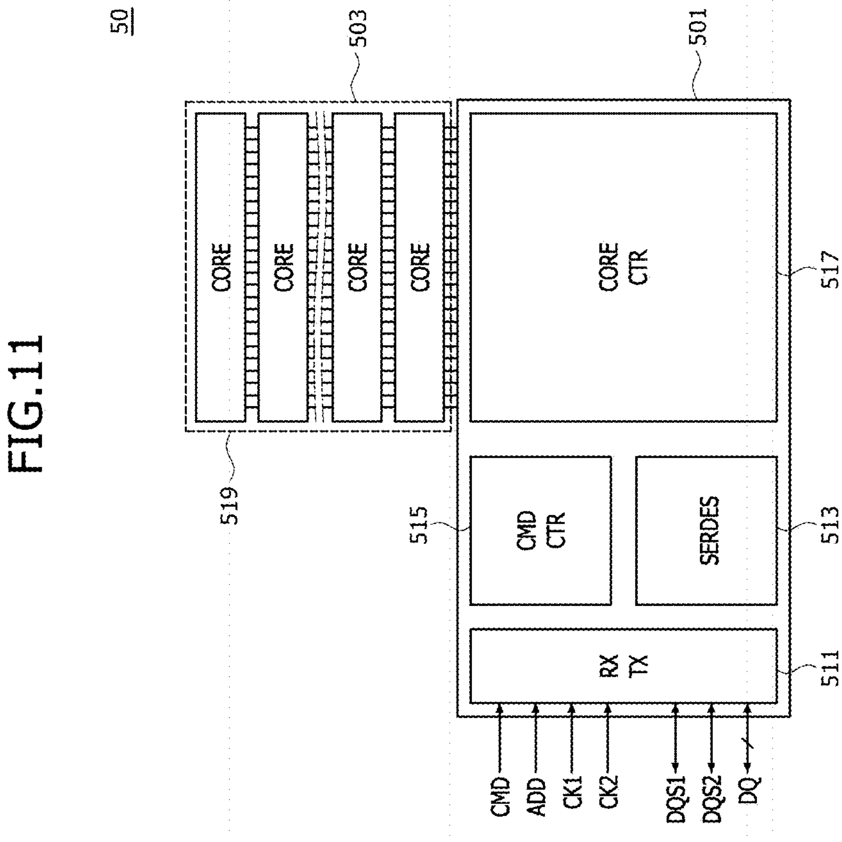
FIG. 11 is a block diagram illustrating a stack memory device according to another embodiment of the present disclosure.

FIG. 11 is a block diagram illustrating a stack memory device 50 according to another embodiment of the present disclosure. As shown in FIG. 11, the stack memory device 50 may include a base chip 501 and a core chip 503. The core chip 503 may be disposed over the base chip 501.

The base chip 501 may include a transmission/reception circuit (RX TX) 511, a serialization/parallelization circuit (SERDES) 513, a command control circuit (CMD CTR) 515, and a core control circuit (CORE CTR) 517.

The transmission/reception circuit 511 may receive a command CMD, an address ADD, and clock signals CK1 and CK2 from an external device for various internal operations on the core chip 503. The transmission/reception circuit 511 may receive data DQ, based on data strobe signals DQS1 and DQS2 for a write operation on the core chip 503 and may transmit the data DQ, based on the data strobe signals DQS1 and DQS2 for a read operation on the core chip 503.

Figure 12:
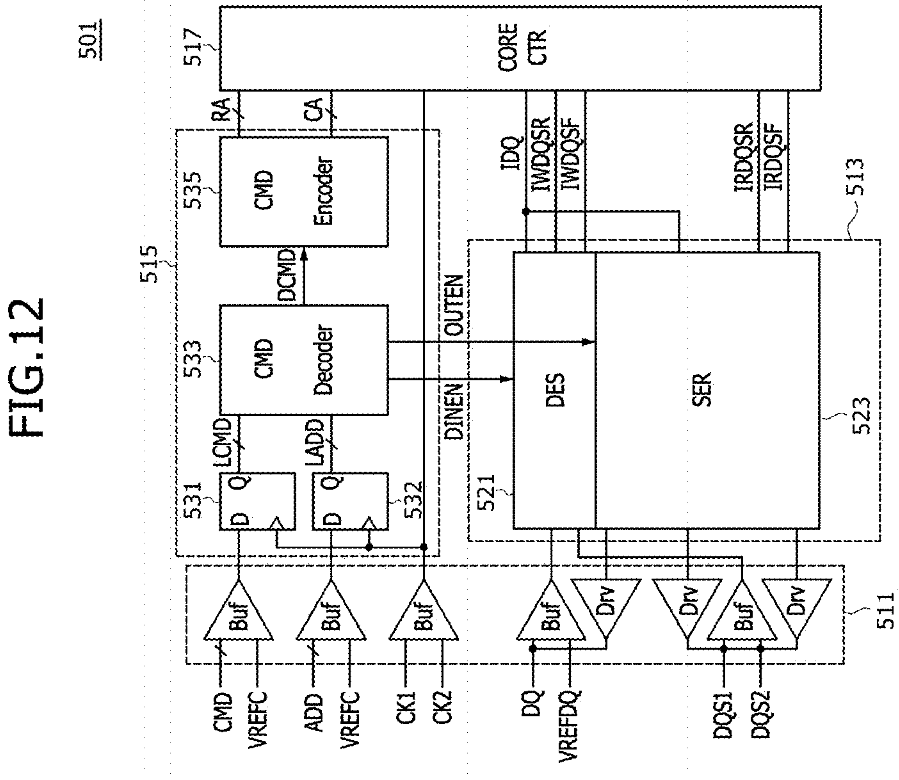
FIG. 12 is a block diagram illustrating an embodiment of a base chip included in the stack memory device shown in FIG. 11.

The serialization/parallelization circuit 513 may receive the data DQ serially, based on the data strobe signals DQS1 and DQS2, to perform the write operation on the core chip 503 to generate write data strobe signals (e.g., IWDQSR and IWDQSF of FIG. 12) and parallelized internal data (e.g., IDQ of FIG. 12). The serialization/parallelization circuit 513 may receive read data strobe signals (e.g., IRDQSR and IRDQSF of FIG. 12) and internal data IDQ, in parallel, to perform the read operation on the core chip 503 to generate data strobe signals DQS1 and DQS2 and serialized data DQ.

The command control circuit 515 may decode the command CMD and address ADD to generate a data input control signal (e.g., DINEN of FIG. 12) and a data output control signal (e.g., OUTEN of FIG. 12) that control the serialization/parallelization circuit 513. The command control circuit 515 may decode the command CMD and the address ADD to generate a decoding command (e.g., DCMD of FIG. 12) and may encode the decoding command DCMD to generate a row control signal (e.g., RA of FIG. 12) that controls the row operation of the core control circuit 517 and a column control signal (e.g., CA of FIG. 12) that controls the column operation of the core control circuit 517. The decoding command DCMD may be implemented as a signal transmitted through a first interface, and the row control signal RA and column control signal CA may be implemented as signals transmitted through a second interface. The first interface and the second interface may be implemented differently. The row operation of the core control circuit 517 may be performed to select at least one of the word lines to which memory cells included in the core chip 503 are connected, and the column operation of the core control circuit 517 may be performed to select at least one of the bit lines to which memory cells included in the core chip 503 are connected. The row operation and column operation of the core control circuit 517 may be performed to input and output internal data IDQ to the core chip 503.

When the write operation is performed on the core chip 503, based on the row control signal RA and the column control signal CA, the core control circuit 517 may store the internal data IDQ, parallelized in synchronization with the write data strobe signals IWDQSR and IWDQSF, in the core chip 503. When the read operation is performed on the core chip 503, based on the row control signal RA and the column control signal CA, the core control circuit 517 may output the internal data IDQ, parallelized in synchronization with the write read strobe signals IRDQSR and IRDQSF, from the core chip 503.

FIG. 12 is a block diagram illustrating the base chip 501 included in the stack memory device 50 shown in FIG. 11. As shown in FIG. 12, the base chip 501 may include the transmission/reception circuit 511, the serialization/parallelization circuit 513, the command control circuit 515, and the core control circuit 517.

The transmission/reception circuit 511 may include a plurality of buffers and drivers. The transmission/reception circuit 511 may receive the command CMD, the address ADD, and the clock signals CK1 and CK2 from an external device for various internal operations on the core chip 503. The transmission/reception circuit 511 buffers and may receive the command CMD and the address ADD, based on a reference voltage VREFC, and may buffer and receive the clock signals CK1 and CK2. The transmission/reception circuit 511 may receive the data DQ, based on the data strobe signals DQS1 and DQS2, to perform the write operation on the core chip 503 and may transmit the data DQ, based on the data strobe signals DQS1 and DQS2, to perform the read operation on the core chip 503.

The serialization/parallelization circuit 513 may include a parallelization circuit (DES) 521 and a serialization circuit (SER) 523.

The parallelization circuit 521 may be electrically connected to the transmission/reception circuit 511 and the command control circuit 515 to receive the buffered data DQ and the data strobe signals DQS1 and DQS2 from the transmission/reception circuit 511 and to receive a data input control signal DINEN from the command control circuit 515. When the data input control signal DINEN is generated to perform the write operation on the core chip 503, the parallelization circuit 521 may receive the data DQ serially, based on the data strobe signals DQS1 and DQS2, to generate the write data strobe signals IWDQSR and IWDQSF and the parallelized internal data IDQ. The parallelization circuit 521 may output the write data strobe signals IWDQSR and IWDQSF and the parallelized internal data IDQ to the electrically connected core control circuit 517.

The parallelization circuit 521 may be electrically connected to the core control circuit 517 and the command control circuit 515 to receive the read data strobe signals IRDQSR and IRDQSF and the internal data IDQ from the core control circuit 517 and to receive the data output control signal OUTEN from the command control circuit 515. When the data output control signal OUTEN is generated to perform the read operation on the core chip 503, the serialization circuit 523 may receive the internal data IDQ in parallel and in synchronization with the read data strobe signals IRDQSR and IRDQSF to generate the data strobe signals DQS1 and DQS2 and the serialized data DQ. The serialization circuit 523 may output the data strobe signals DQS1 and DQS2 and the serialized data DQ to the electrically connected transmission/reception circuit 511.

The command control circuit 515 may receive the command CMD, the address ADD, and clock signals CK1 and CK2 from the electrically connected transmission/reception circuit 511. The command control circuit 515 may latch the command CMD and the address ADD in synchronization with the clock signals CK1 and CK2 to generate a latch command LCMD and a latch address LADD, decode the latch command LCMD and the latch address LADD to generate the decoding command DCMD transmitted through the first interface, and encode the decoding command DCMD to generate the row control signal RA and the column control signal CA transmitted through the second interface. The command control circuit 515 may include command latches 531 and 532, a command decoder 533, and a command encoder 535. The command latch 531 may latch the command CMD received from the transmission/reception circuit 511 in synchronization with the clock signal CK1 and may output the latched command CMD as the latch command LCMD. The command latch 532 may latch the address ADD received from the transmission/reception circuit 511 in synchronization with the clock signal CK2 and may output the latched address ADD as the latch address LADD. The command decoder 533 may decode the latch command LCMD and the latch address LADD to generate the decoding command DCMD, the data input control signal DINEN, and the data output control signal OUTEN, which are transmitted through the first interface. The data input control signal DINEN may be generated to perform the write operation on the core chip 503, and the data output control signal OUTEN may be generated to perform the read operation on the core chip 503. The command encoder 535 may encode the decoding command DCMD to generate the row control signal RA and the column control signal CA that are transmitted through the second interface.

The core control circuit 517 may be electrically connected to the command control circuit 515 and the parallelization circuit 521 to receive the row control signal RA and the column control signal CA from the command control circuit 515 and to receive the write data strobe signals IWDQSR and IWDQSF and the parallelized internal data IDQ from the parallelization circuit 521. When the write operation is performed on the core chip 503, based on the row control signal RA and the column control signal CA, the core control circuit 517 may store the parallelized internal data IDQ, in synchronization with the write data strobe signals IWDQSR and IWDQSF, in the core chip 503. When the read operation is performed on the core chip 503, based on the row control signal RA and the column control signal CA, the core control circuit 517 may output the parallelized internal data IDQ, in synchronization with the read data strobe signals IRDQSR and IRDQSF, from the core chip 503.

The stacked memory device 50, configured as described above, may include the command control circuit 515 that can change the interface for command and signal transmission in the base chip 501 when performing the write and read operations on the core chip 503, thereby performing the write and read operations on the core chip 503 through a plurality of interfaces.

FIG. 13 is a table illustrating the operation of the command decoder 533 included in the base chip shown in FIG. 12.

Referring to FIG. 13, together with FIG. 12, the command decoder 533 may decode the latch command LCMD and the latch address LADD generated by latching the command CMD in synchronization with the clock signals CK1 and CK2 to generate the decoding command DCMD that is transmitted through the first interface. For example, when the latch command LCMD and the latch address LADD having a first logic bit set are received, the command decoder 533 may generate the decoding command DCMD for mode register set (MRS). The latch command LCMD and the latch address LADD having the first logic bit set may include a clock enable signal CKE set to 'H' and 'H' in successive cycles, a chip selection signal CS set to 'L', an active signal ACT set to 'H', low access strobing signal RAS and address A16 set to 'L', column access strobing signal CAS and address A15 set to 'L', write enable signal WE and address A14 set to 'L', and address combinations BG0~BG1, BA0~BA1, C2~C0, A12, A17, A13, A11, A10, and A0~A9 set in various ways. The first logic bit set of the latch command LCMD and the latch address LADD, shown in Table 13, is an example defined in the JDEC specification and may be modified in various ways depending on the embodiment.

In another example, when the latch command LCMD and the latch address LADD having a second logic bit set are received, the command decoder 533 may generate the decoding command DCMD to perform a write operation (Fixed, BL8 or BC4). The latch command LCMD and the latch address LADD having the second logic bit set may include a clock enable signal CKE set to 'H' and 'H' in successive cycles, a chip selection signal CS set to 'L', an active signal ACT set to 'H', low access strobing signal RAS and address A16 set to 'H', column access strobing signal CAS and address A15 set to 'L', write enable signal WE and address A14 set to 'L', and the address combinations BG0~BG1, BA0~BA1, C2~C0, A12, A17, A13, A11, A10, and A0~A9 set in various ways. The second logic bit set of the latch command LCMD and the latch address LADD, shown in Table 13, is an example defined in the JDEC specification and may be modified in various ways depending on the embodiment.

FIGS. 14 and 15 are tables illustrating the operation of the command decoder 535 included in the base chip shown in FIG. 12.

Referring to FIG. 14, together with FIG. 12, the command encoder 535 may encode the decoding command DCMD to generate the row control signal RA that is transmitted through the second interface. For example, when the decoding command DCMD for pre-charge (PREpb) is received, the command encoder 535 may encode the decoding command DCMD to generate the row control signal RA having the first logic bit set, which is transmitted through the second interface. The row control signal RA having the first logic bit set may include a first bit RA[0] of the row control signal set to 'H' in synchronization with a rising edge 'R' or falling edge 'F' of the clock signal, second and third bits RA[1:2] of the row control signal set to 'L', a fourth bit RA[3] of the row control signal set to pseudo channel PC, fifth and sixth bits RA[4:5] of the row control signal set to slice IDs SID0 and SID1, respectively, and seventh through tenth bits RA[6:9] of the row control signal set to bank addresses BA0, BA1, BA2, and BA3, respectively. The first logic bit set of the row control signal RA, shown in Table 14, is an example defined in the JDEC specification and may be modified in various ways depending on the embodiment.

In another example, when the decoding command DCMD for power down exit (PDX) or self-refresh exit (SRX) is received, the command encoder 535 may encode the decoding command DCMD to generate the row control signal RA having the second logic bit set, which is transmitted through the second interface. The row control signal RA having the second logic bit set may include first through fourth bits RA[0:3] of the row control signal set to 'H' in synchronization with the rising edge 'R' of the clock signal. The second logic bit set of the row control signal RA, shown in Table 14, is an example defined in the JDEC specification and may be modified in various ways depending on the embodiment.

Referring to FIG. 15, together with FIG. 12, the command encoder 535 may encode the decoding command DCMD to generate the column control signal CA that is transmitted through the second interface.

For example, when the decoding command DCMD for read (RD) is received, the command encoder 535 may encode the decoding command DCMD to generate the column control signal CA having the first logic bit set, which is transmitted through the second interface. The column control signal CA having the first logic bit set may include first and third bits CA[0] and CA[2] of the column control signal set to 'H' in synchronization with the rising edge 'R' of the clock signal, second and fourth bits CA[1] and CA[3] of the column control signal set to 'L', a fifth bit CA[4] of the column control signal set to pseudo channel PC, sixth and seventh bits CA[5] and CA[6] of the column control signal set to slice IDs SID0 and SID1, respectively, an eighth bit RA[7] of the column control signal set to bank address BA0, first through third bits CA[0:3] of the column control signal set to bank addresses BA1, BA2, and BA3, respectively, in synchronization with the falling edge 'F' of the clock signal, fourth through eighth bits CA[3:7] of the column control signal set to column addresses CA0 through CA5, respectively, and ninth bit CA[8] of the column control signal for setting the column numbers 1, 2, 3, 5, 6, and 7. The first logic bit set of the column control signal CA, shown in Table 15, is an example defined in the JDEC specification and may be modified in various ways depending on the embodiment.

In another example, when the decoding command DCMD for write (WT) is received, the command encoder 535 may encode the decoding command DCMD to generate the column control signal CA having a second logic bit set, which is transmitted through the second interface. The column control signal CA having the second logic bit set may include a first bit CA[0] of the column control signal set to 'H' in synchronization with the rising edge 'R' of the clock signal, second and fourth bits CA[1] and CA[3] of the column control signal set to 'L', fifth bit CA[4] of the column control signal set to pseudo channel PC, sixth and seventh bits CA[5] and CA[6] of the column control signal set to slice IDs SID0 and SID1, respectively, eighth bit RA[7] of the column control signal set to bank address BA0, first through third bits CA[0:3] of the column control signal set to bank addresses BA1, BA2, and BA3, respectively, in synchronization with the falling edge 'F' of the clock signal, fourth through eighth bits CA[3:7] of the column control signal set to column addresses CA0 through CA5, respectively, and a ninth bit CA[8] of the column control signal for setting the column numbers 1, 2, 3, 5, and 6. The second logic bit set of the column control signal CA, shown in Table 15, is an example defined in the JDEC specification and may be modified in various ways depending on the embodiment.

Concepts are disclosed in conjunction with various embodiments as described above. Those skilled in the art will understand that various modifications, additions, and substitutions are possible, without departing from the scope and spirit of the present disclosure. Accordingly, the embodiments disclosed in the present specification should not be considered from a restrictive standpoint but rather from an illustrative standpoint. The scope of the present disclosure is not limited to the above descriptions, and all of distinctive features within an equivalent scope should be construed as being included in the present disclosure.

What is claimed is:

1. A stack memory device comprising:

a command control circuit configured to:

latch a command and an address in synchronization with a clock signal to generate a latch command and a latch address, decode the latch command and the latch address to generate a decoding command that is transmitted through a first interface and to generate data to a parallelization circuit, and encode the decoding command to generate a row control signal and a column control signal that are transmitted through a second interface; and a core control circuit configured to, based on the row control signal and the column control signal, control internal operations performed on a core chip, wherein the parallelization circuit is configured to receive the data serially to generate parallelized internal data.

2. The stack memory device of claim 1, wherein the first interface is different from the second interface.

3. The stack memory device of claim 1, wherein the command control circuit comprises:

a first command latch configured to latch the command in synchronization with the clock signal and output the latched command as a latch command;

a second command latch configured to latch the address in synchronization with the clock signal and output the latched address as a latch address;

a command decoder configured to decode the latch command and the latch address to generate the decoding command; and a command encoder configured to encode the decoding command to generate the row control signal and the column control signal.

4. The stack memory device of claim 1, wherein the command control circuit is configured to:

decode the latch command and the latch address to generate a data input control signal to perform a write operation on the core chip; and decode the latch command and the latch address to generate a data output control signal to perform a read operation on the core chip.

5. The stack memory device of claim 1, wherein the parallelization circuit is configured to, based on the data received serially and a data strobe signal, when a data input control signal is generated to perform a write operation on the core chip, generate a write data strobe signal and the parallelized internal data to output to the core control circuit.

6. The stack memory device of claim 5, wherein the core control circuit is configured to store the parallelized internal data in the core chip, in synchronization with the write data strobe signal, when the write operation on the core chip is performed.

7. The stack memory device of claim 1, further comprising a serialization circuit configured to receive internal data, from the core control circuit, in parallel and in synchronization with a read data strobe signal, when a data output control signal is generated to perform a read operation on the core chip, to generate a data strobe signal and serialized data.

8. The stack memory device of claim 7, wherein the core control circuit is configured to output the internal data from the core chip, in synchronization with the read data strobe signal, when the read operation on the core chip is performed.

9. A stack memory device comprising:

a command decoder configured to decode a latch command and a latch address to generate a decoding command that is transmitted through a first interface and to generate data to a parallelization circuit;

a command encoder configured to encode the decoding command to generate a row control signal and a column control signal that are transmitted through a second interface; and a core control circuit configured to, based on the row control signal and the column control signal, control internal operations performed on a core chip, wherein the parallelization circuit is configured to receive the data serially to generate parallelized internal data.

10. The stack memory device of claim 9, wherein the first interface is different from the second interface.

11. The stack memory device of claim 9, wherein the command decoder is configured to:

decode the latch command and the latch address to generate a data input control signal to perform a write operation on the core chip; and decode the latch command and the latch address to generate a data output control signal to perform a read operation on the core chip.

12. The stack memory device of claim 11, wherein the parallelization circuit is configured to, based on the data received serially and a data strobe signal, when a data input control signal is generated to perform a write operation on the core chip, generate a write data strobe signal and the parallelized internal data to output to the core control circuit.

13. The stack memory device of claim 12, wherein the core control circuit is configured to store the parallelized internal data in the core chip, in synchronization with the write data strobe signal, when the write operation on the core chip is performed.

14. The stack memory device of claim 11, further comprising a serialization circuit configured to receive internal data from the core control circuit, in parallel and in synchronization with read data strobe signal, when a data output control signal is generated to perform a read operation on the core chip, to generate a data strobe signal and serialized data.

15. The stack memory device of claim 14, wherein the core control circuit is configured to output the internal data in synchronization with the read data strobe signal when the read operation on the core chip is performed.

16. A stack memory device comprising:

a command decoder configured to:

decode a latch command and a latch address to generate a decoding command that is transmitted through a first interface and data to a parallelization circuit, generate a data input control signal to perform a write operation on the core chip, and generate a data output control signal to perform a read operation on the core chip;

a command encoder configured to encode the decoding command to generate a row control signal and a column control signal that are transmitted through a second interface; and a core control circuit configured to, based on the data input control signal, the data output control signal, the row control signal, and the column control signal, control internal operations performed on the core chip, wherein the parallelization circuit is configured to receive the data serially to generate parallelized internal data.

17. The stack memory device of claim 16, wherein the parallelization circuit is configured to, based on the data received serially and a data strobe signal, when a data input control signal is generated, generate a write data strobe signal and the parallelized internal data to output to the core control circuit.

18. The stack memory device of claim 17, wherein the core control circuit is configured to store the parallelized internal data in the core chip, in synchronization with the write data strobe signal, when the write operation on the core chip is performed.

19. The stack memory device of claim 16, further comprising a serialization circuit configured to receive internal data from the core control circuit, in parallel and in synchronization with read data strobe signal, when the data output control signal is generated, to generate a data strobe signal and serialized data.

20. The stack memory device of claim 19, wherein the core control circuit is configured to output the internal data from the core chip, in synchronization with the read data strobe signal, when the read operation on the core chip is performed.

21. A stack memory device comprising:

a base chip; and a core chip stacked on the base chip and electrically connected to the base chip, wherein the base chip comprises:

a command control circuit configured to:

latch a command and an address in synchronization with a clock signal to generate a latch command and a latch address, decode the latch command and the latch address to generate a decoding command that is transmitted through a first interface and to generate data to a parallelization circuit, and encode the decoding command to generate a row control signal and a column control signal that are transmitted through a second interface; and a core control circuit configured to, based on the row control signal and the column control signal, control internal operations performed on the core chip, wherein the parallelization circuit is configured to receive the data serially to generate parallelized internal data.

22. The stack memory device of claim 21, wherein the command control circuit is configured to:

decode the latch command and the latch address to generate a data input control signal to perform a write operation on the core chip; and decode the latch command and the latch address to generate a data output control signal to perform a read operation on the core chip.

23. The stack memory device of claim 21, wherein the parallelization circuit is configured to, based on the data received serially and a data strobe signal, when a data input control signal is generated to perform a write operation on the core chip, generate a write data strobe signal and the parallelized internal data to output to the core control circuit, wherein the core control circuit is configured to store the parallelized internal data in the core chip, in synchronization with the write data strobe signal, when the write operation on the core chip is performed.

24. The stack memory device of claim 21, further comprising a serialization circuit configured to receive internal data from the core control circuit, in parallel and in synchronization with the read data strobe signal, when a data output control signal is generated to perform a read operation on the core chip, to generate a data strobe signal and serialized data, wherein the core control circuit is configured to output the internal data from the core chip, in synchronization with the read data strobe signal, when the read operation on the core chip is performed.

* * * * *